(12) United States Patent
Kwok et al.

(10) Patent No.: US 8,975,144 B2
(45) Date of Patent: Mar. 10, 2015

(54) CONTROLLING THE SHAPE OF SOURCE/DRAIN REGIONS IN FINFETS

(71) Applicant: Taiwan Semiconductor Manufacturing Company, Ltd., Hsin-Chu (TW)

(72) Inventors: Tsz-Mei Kwok, Hsin-Chu (TW); Chien-Chang Su, Kaohsiung (TW); Kuan-Yu Chen, Taipei (TW); Hsueh-Chang Sung, Zhubei (TW); Hsien-Hsin Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 197 days.

(21) Appl. No.: 13/691,093

(22) Filed: Nov. 30, 2012

(65) Prior Publication Data

US 2013/0089959 A1 Apr. 11, 2013

Related U.S. Application Data

(63) Continuation of application No. 12/831,925, filed on Jul. 7, 2010, now Pat. No. 8,362,575.

(60) Provisional application No. 61/246,883, filed on Sep. 29, 2009.

(51) Int. Cl.
| | |
|---|---|
| *H01L 21/336* | (2006.01) |
| *H01L 29/66* | (2006.01) |
| *H01L 29/78* | (2006.01) |
| *H01L 21/76* | (2006.01) |
| *H01L 29/04* | (2006.01) |

(52) U.S. Cl.
CPC ...... *H01L 29/66795* (2013.01); *H01L 29/7848* (2013.01); *H01L 29/785* (2013.01); *H01L 21/76* (2013.01); *H01L 29/045* (2013.01)
USPC ........................................ 438/300; 438/294

(58) Field of Classification Search
None
See application file for complete search history.

(56) References Cited

U.S. PATENT DOCUMENTS

| | | |
|---|---|---|
| 6,706,571 B1 | 3/2004 | Yu et al. |
| 6,858,478 B2 | 2/2005 | Chau et al. |

(Continued)

OTHER PUBLICATIONS

Tan, K-M et al., "Sub-30nm Strained p-Channel Fin-Type Field-Effect Transistors with Condensed SiGe Source/Drain Stressors," Japanese Journal of Applied Physics, vol. 46, No. 4B, 2007, pp. 2058-2061.

*Primary Examiner* — Hoang-Quan Ho
(74) *Attorney, Agent, or Firm* — Slater & Matsil, L.L.P.

(57) ABSTRACT

An integrated circuit structure includes a fin field-effect transistor (FinFET) including a semiconductor fin over and adjacent to insulation regions; and a source/drain region over the insulation regions. The source/drain region includes a first and a second semiconductor region. The first semiconductor region includes silicon and an element selected from the group consisting of germanium and carbon, wherein the element has a first atomic percentage in the first semiconductor region. The first semiconductor region has an up-slant facet and a down-slant facet. The second semiconductor region includes silicon and the element. The element has a second atomic percentage lower than the first atomic percentage. The second semiconductor region has a first portion on the up-slant facet and has a first thickness. A second portion of the second semiconductor region, if any, on the down-slant facet has a second thickness smaller than the first thickness.

20 Claims, 6 Drawing Sheets

(56) References Cited

U.S. PATENT DOCUMENTS

| | | |
|---|---|---|
| 6,960,517 B2 | 11/2005 | Rios et al. |
| 7,190,050 B2 | 3/2007 | King et al. |
| 7,247,887 B2 | 7/2007 | King et al. |
| 7,265,008 B2 | 9/2007 | King et al. |
| 7,425,500 B2 | 9/2008 | Metz et al. |
| 7,508,031 B2 | 3/2009 | Liu et al. |
| 7,528,465 B2 | 5/2009 | King et al. |
| 7,569,489 B2 | 8/2009 | Dyer et al. |
| 7,605,449 B2 | 10/2009 | Liu et al. |
| 7,622,773 B2 | 11/2009 | Irisawa et al. |
| 7,723,193 B2 | 5/2010 | Rhee et al. |
| 7,750,338 B2 | 7/2010 | Wang |
| 7,772,640 B2 | 8/2010 | Miyano |
| 7,915,693 B2 | 3/2011 | Okano |
| 8,110,458 B2 | 2/2012 | Jin et al. |
| 2005/0153490 A1 | 7/2005 | Yoon et al. |
| 2007/0075372 A1 | 4/2007 | Terashima et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0241399 A1 | 10/2007 | Irisawa et al. |
| 2007/0257296 A1 | 11/2007 | Miyano |
| 2008/0290470 A1 | 11/2008 | King et al. |
| 2008/0296632 A1 | 12/2008 | Moroz et al. |
| 2009/0181477 A1 | 7/2009 | King et al. |
| 2010/0207209 A1 | 8/2010 | Inokuma |
| 2011/0073952 A1 | 3/2011 | Kwok et al. |
| 2011/0147812 A1 | 6/2011 | Steigerwald et al. |
| 2011/0147828 A1 | 6/2011 | Murthy et al. |
| 2011/0147842 A1 | 6/2011 | Cappellani et al. |
| 2011/0254090 A1 | 10/2011 | Cheng et al. |
| 2011/0272763 A1 | 11/2011 | Sasaki et al. |

US 8,975,144 B2

CONTROLLING THE SHAPE OF SOURCE/DRAIN REGIONS IN FINFETS

This application is a continuation of and claims benefit of U.S. patent application Ser. No. 12/831,925, filed Jul. 7, 2010, entitled "Controlling the Shape of Source/Drain Regions in FinFETs," which further claims the benefit of U.S. Provisional Application No. 61/246,883 filed on Sep. 29, 2009, entitled "Controlling the Shape of Source/Drain Regions in FinFETs," which applications are hereby incorporated herein by reference.

TECHNICAL FIELD

This disclosure relates generally to semiconductor devices, and more particularly to structures and formation methods of fin field-effect transistors (FinFETs).

BACKGROUND

With the increasing down scaling of integrated circuits and increasingly higher requirements for integrated circuits, transistors need to have higher drive currents with increasingly smaller dimensions. Fin field-effect transistors (FinFETs) were thus developed.

As is known in the art, the drive currents of MOS transistors may benefit from the stresses in the channel regions of the MOS transistors. Therefore, the source and drain regions of the FinFET may be formed by removing portions of the respective fin not covered by the gate electrode, and re-growing SiGe or SiC in the spaces left by the removed fin. The re-grown SiGe or SiC are used to form source and drain regions. The re-grown source and drain regions may also have the benefit of reducing the source/drain resistance if the re-grown source/drain regions are in-situ doped with impurities in the re-growth process.

The re-growth of the source/drain regions, however, suffers from drawbacks. In contrast to conventional planar devices, the re-growth of the source/drain regions is not confined by shallow trench isolation regions, and hence the width of the re-grown SiGe is not limited. Since SiGe has a growth rate smaller on (111) planes than on other planes, the re-grown source/drain regions may not have a rectangular shape as that of the original fin. Instead, the re-grown SiGe regions may extend laterally and form facets. This may cause the reduction in the distance between a re-grown SiGe region and a re-grown SiGe region of a neighboring FinFET. Accordingly, the merging window, in which the neighboring re-growing source/drain regions will not merge, is reduced.

SUMMARY

In accordance with one aspect of the embodiment, an integrated circuit structure includes a fin field-effect transistor (FinFET) including a semiconductor fin over and adjacent insulation regions; and a source/drain region over the insulation regions. The source/drain region includes a first and a second semiconductor region. The first semiconductor region includes silicon and an element selected from the group consisting of germanium and carbon, wherein the element has a first atomic percentage in the first semiconductor region. The first semiconductor region has an up-slant facet and a down-slant facet. The second semiconductor region includes silicon and the element. The element has a second atomic percentage lower than the first atomic percentage. The second semiconductor region has a first portion on the up-slant facet and has a first thickness. A second portion of the second semiconductor region, if any, on the down-slant facet has a second thickness smaller than the first thickness.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the embodiments provide many applicable inventive concepts that can be embodied in a wide variety of specific contexts.

A novel fin field-effect transistor (FinFET) embodiment and the method of forming the same are presented. The intermediate stages of manufacturing the embodiment are illustrated. The variations of the embodiment are discussed. Throughout the various views and illustrative embodiments, like reference numbers are used to designate like elements.

Figure 1:
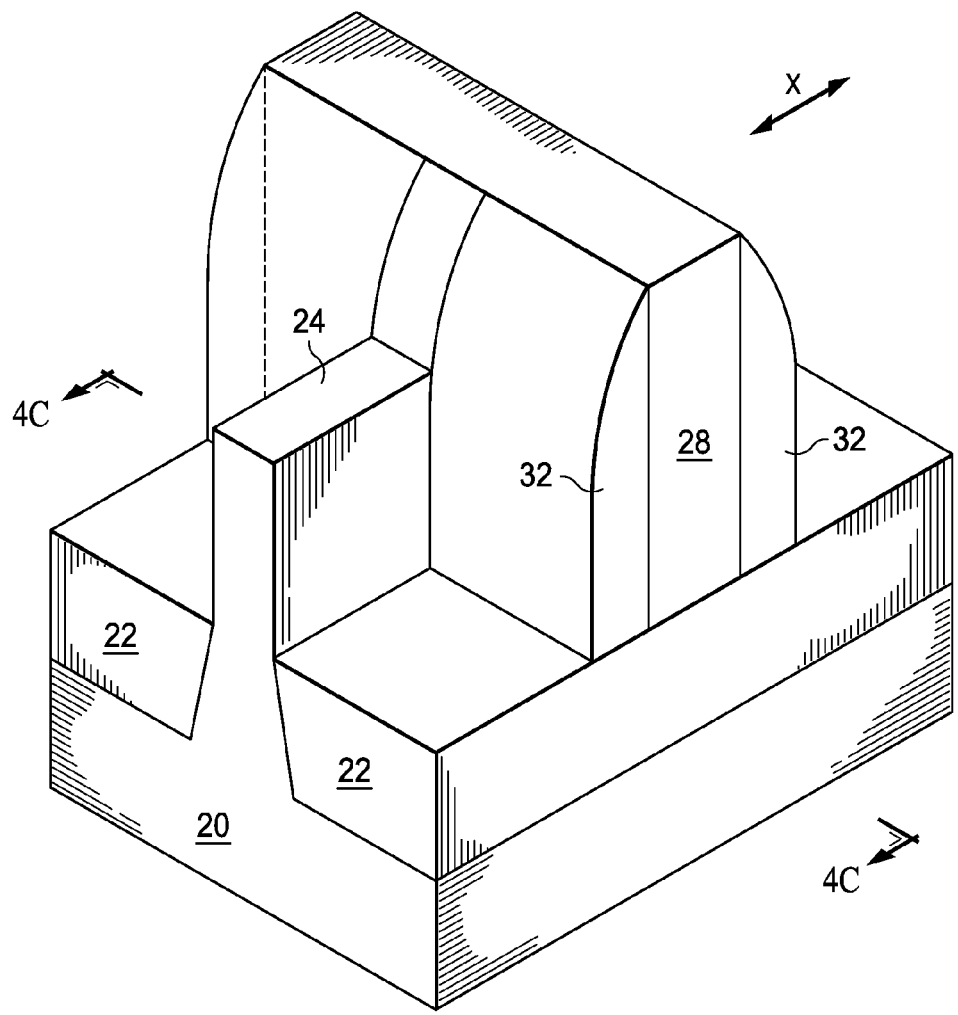
FIGS. 1 through 7 are perspective views and cross-sectional views of intermediate stages in the manufacturing of a FinFET in accordance with an embodiment.

Referring to FIG. 1, an integrated circuit structure is formed. The integrated circuit structure includes substrate 20, which may be a bulk silicon substrate. Substrate 20 may be doped with a p-type or an n-type impurity. Isolation regions such as shallow trench isolation (STI) regions 22 may be formed in substrate 20. Fin 24 is formed over top surfaces of STI regions 22. Fin 24 may be formed by removing top portions of STI regions 22, so that a portion of substrate 20 between neighboring STI regions 22 becomes a fin. Alternatively, fin 24 may be formed on top of substrate 20 by an epitaxial growth.

In an embodiment, substrate 20 has a surface orientation of (100), and fin 24 extends along the <110> direction (X-direction as shown in FIG. 1). In other embodiments, substrate 20 may have other surface orientations such as (110), in which case fin 24 may extend in directions such as <100>. Gate dielectric 26 (not shown in FIG. 1, please refer to FIGS. 2B and 2C), which may be formed of silicon oxide, high-k dielectric materials, or the like, is formed on the top surface and sidewalls of fin 24. Gate electrode 28 is formed on gate dielectric 26. Gate spacers 32 are formed on the sidewalls of gate electrode 28.

Figure 2A:
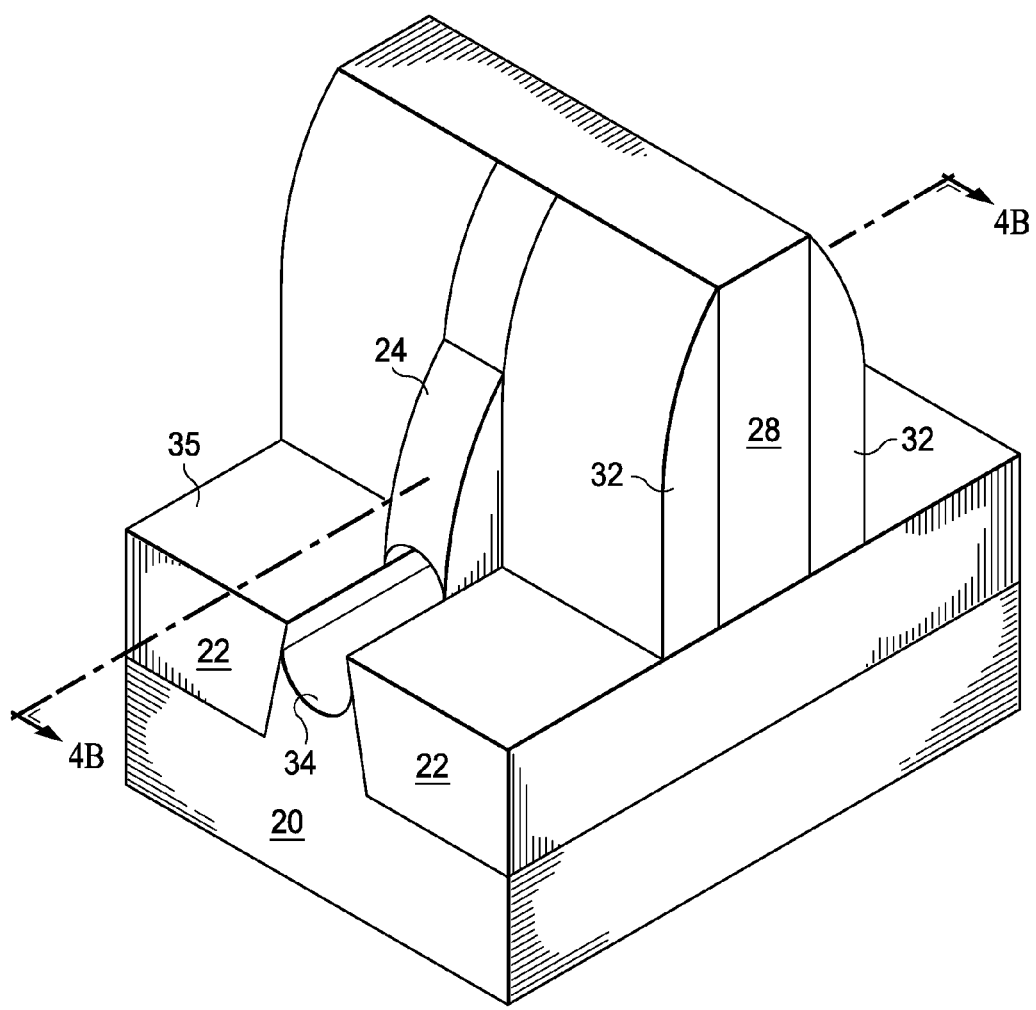
Figure 2B:
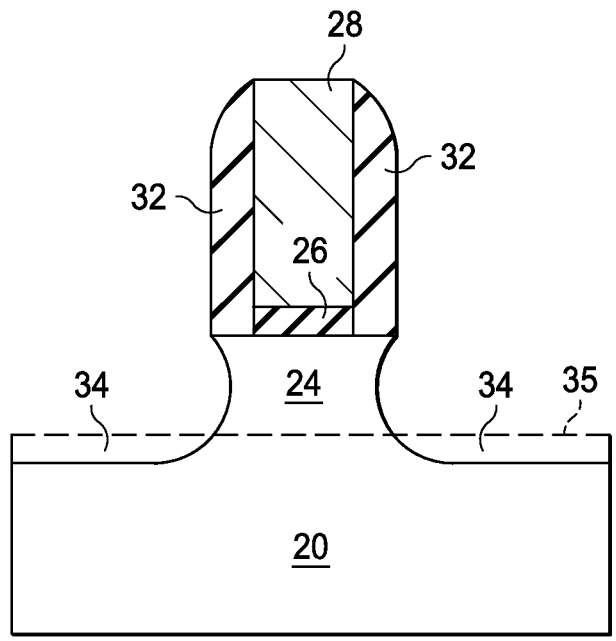

Referring to FIG. 2A, the exposed portions of fin 24 not covered by gate dielectric 26, gate electrode 28, and gate spacers 32 are removed (recessed), while the covered portion of fin 24 is not removed. The removal may be performed by a dry etch. FIG. 2B illustrates a cross-sectional view of the structure shown in FIG. 2A, wherein the cross-sectional view is obtained in a vertical plane crossing line 4B-4B in FIG. 2A. The spaces left by the removed portions of fin 24 are referred to as recesses 34 hereinafter. Recesses 34 may have a bottom level with top surface 35 of STI regions 22. Alternatively, the bottom of recesses 34 may be lower than top surface 35 of STI regions 22, as illustrated in FIGS. 2A and 2B.

Figure 2C:
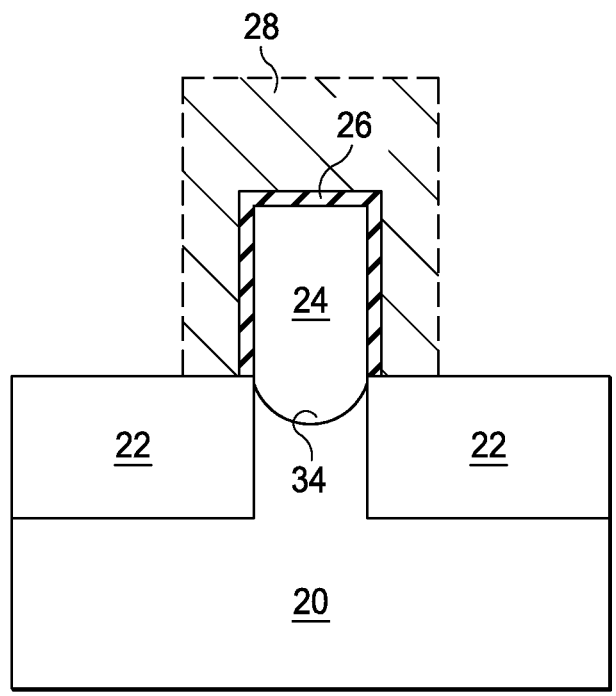

In a subsequent discussion, cross-sectional views are used to explain the concept of the embodiments. Unless specified otherwise, the cross-sectional views are obtained in vertical planes (referred to as source/drain planes hereinafter) crossing lines at the same position as line 4C-4C in FIG. 1. It is noted that line 4C-4C crosses the (would-be) source/drain region, but not gate electrode 28. FIG. 2C illustrates the cross-sectional view of the structure shown in FIG. 2A, wherein the cross-sectional view is obtained in the source/drain plane. Further, gate dielectric 26 and gate electrode 28 are also illustrated. Since gate dielectric 26 and gate electrode 28 are not in the source/drain plane, they are illustrated using dotted lines.

Figure 3:
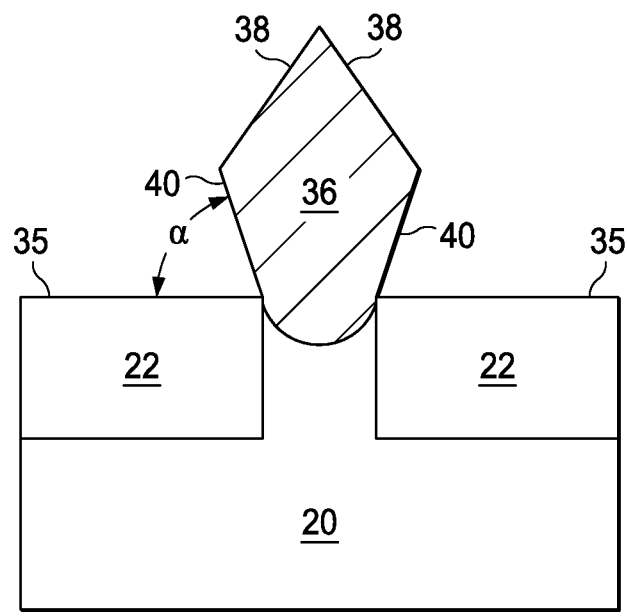

Next, as shown in FIG. 3, SiGe region 36, which may also be referred to as a source/drain stressor 36, is epitaxially grown in recesses 34 by selective epitaxial growth (SEG). SiGe region 36 has a lattice constant greater than the lattice constant of substrate 20. In an exemplary embodiment, SiGe region 36 is formed using chemical vapor deposition (CVD). The precursors may include Si-containing gases and Ge-containing gases, such as $SiH_4$ and $GeH_4$, respectively, and the partial pressures of the Si-containing gases and Ge-containing gases are adjusted to modify the atomic ratio of germanium to silicon. In an embodiment, the resulting SiGe region 36 includes greater than about 20 atomic percent germanium. The germanium percentage in SiGe region 36 may also be between about 20 percent and about 40 atomic percent.

During the epitaxial process for forming SiGe region 36, p-type impurities such as boron may be doped with the proceeding of the epitaxy. The impurity concentration may be between about $1 \times 10^{19}/cm^3$ and about $1 \times 10^{21}/cm^3$. In alternative embodiments, no p-type and n-type impurities are doped, while the doping of source and drain regions are performed in an implantation step performed after the formation of SiGe region 36.

It is observed that due to different growth rates on different surface planes, facets may be formed. For example, the growth rate on surfaces having (111) surface orientations is lower than that of other planes such as (110) and (100) planes. Accordingly, facets 38 and 40, which have the (111) surface orientations (in other word, on (111) planes), have the lowest growth rate, while other planes have higher growth rates. In the beginning of the epitaxial growth of SiGe region 36, facets 38 and 40 may not be formed. However, with the proceeding of the epitaxial growth, due to the difference in growth rates, facets 38 and 40 are gradually formed. Throughout the description, facets 38, which face away from substrate 20, are referred to as up-slant facets, while facets 40, which face toward substrate 20, are referred to as down-slant facets. Down-slant facets 40 and the respective top surfaces 35 of STI regions 22 may have an angle α, which may be about 54.7 degrees. In an embodiment, SiGe region 36 is grown until the portion of the recess below top surfaces 35 of STI regions 22 is fully filled and facets 38 and 40 are substantially fully developed, although SiGe region 36 may be grown further.

Figure 4:
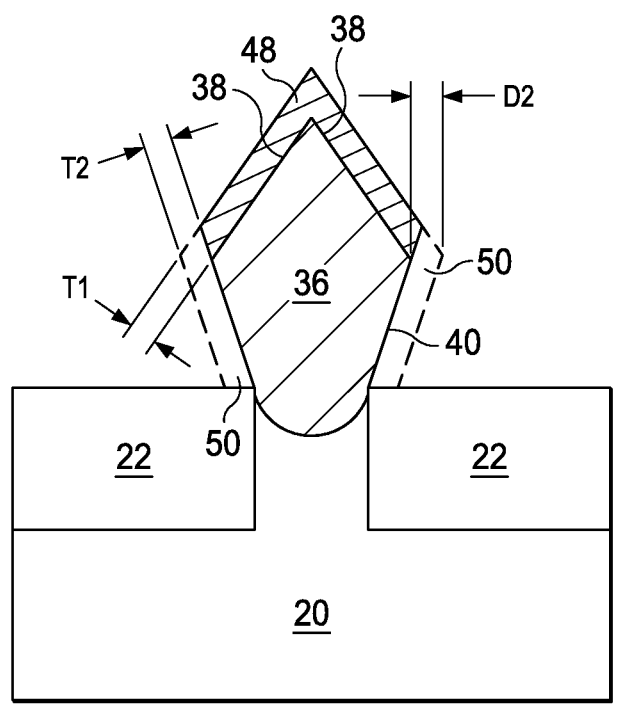

Referring to FIG. 4, process conditions for the epitaxial process are changed to form SiGe region 48 on SiGe region 36, wherein less germanium is introduced than in the formation of SiGe region 36. The formation of SiGe region 48 may be performed in-situ with the formation of SiGe region 36, which means that SiGe region 36 and 48 are formed in a same process chamber with no vacuum break occurring therebetween. In an exemplary embodiment, the partial pressures, hence flow rates of the Ge-containing gases such as $GeH_4$ are reduced to reduce the germanium concentration in SiGe region 48. The resulting SiGe region 48 has a lower germanium atomic percentage than SiGe region 36. In an exemplary embodiment, the atomic percentage of germanium in SiGe region 48 and the atomic percentage of germanium in SiGe region 36 have a difference greater than about 5 atomic percent. For example, if the germanium atomic percentage in SiGe region 36 is 20 percent, the germanium atomic percentage in SiGe region 48 is lower than about 15 percent. The atomic percentages of germanium in SiGe region 48 may also be less than about 15 percent, or less than about 10 percent.

Figure 8:
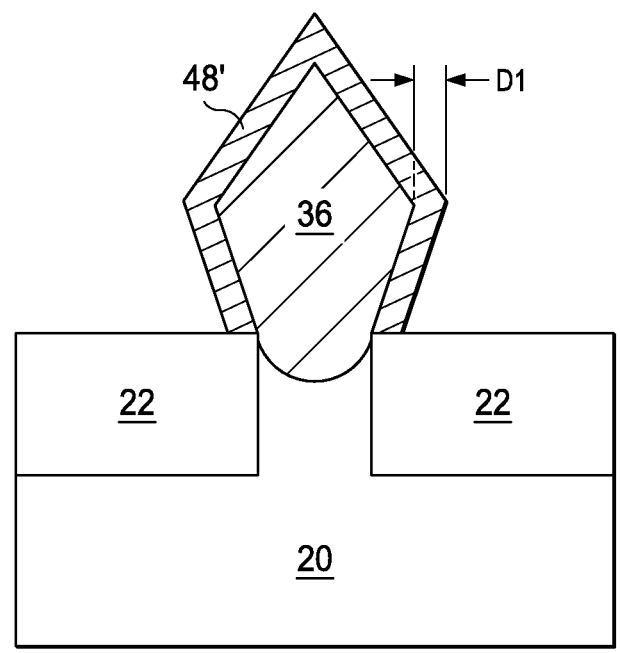
FIG. 8 illustrates an integrated circuit structure with caps formed on re-grown source/drain regions, wherein the caps are also formed on down-slant facets of the re-grown source/drain regions.

It is observed that SiGe has a higher selectivity than silicon for being formed on oxide, which means that if SiGe and silicon are both formed on an oxide, the SiGe will have a lower growth rate than silicon. For SiGe, the selectivity is the growth rate of SiGe on SiGe to the growth rate of SiGe on the oxide. For Si, the selectivity is the growth rate of silicon on SiGe (or silicon) to the growth rate of silicon on the oxide. In an embodiment, the formation process conditions are tuned to further increase the selectivity, so that SiGe region 48 is not formed on STI regions 22, and as a result, not formed on down-slant facets 40. For example, HCl gas may be added (as an etching gas) into the process gas for forming SiGe region 48, with the flow rate of the HCl gas being adjusted. Accordingly, any possible SiGe formed on STI regions 22 is etched since it has a higher etching rate than SiGe formed on SiGe region 36. It is noted that if the process conditions are not tuned, a profile as shown in FIG. 8 may be formed, which is undesirable since the merging window will be undesirably reduced. As a result of the optimized process conditions, SiGe region 48 has a profile as shown in FIG. 4, wherein SiGe region 48 is grown on up-slant facets 38, but not on down-slant facets 40. Alternatively, as shown as regions 50 marked using dotted lines, SiGe region 48 is also grown on down-slant facets 40, but with a much smaller thickness than that of the portions on up-slant facets 38. In an exemplary embodiment, thickness T2 is less than about 20 percent of thickness T1, wherein thickness T1 is the thickness of portions 50 of SiGe region 48 on up-slant facets 38, while thickness T2 is the thickness of the portions of SiGe region 48 on down-slant facets 40. The selectivity of SiGe may be further increased by selecting appropriate materials for STI regions.

Figure 5:
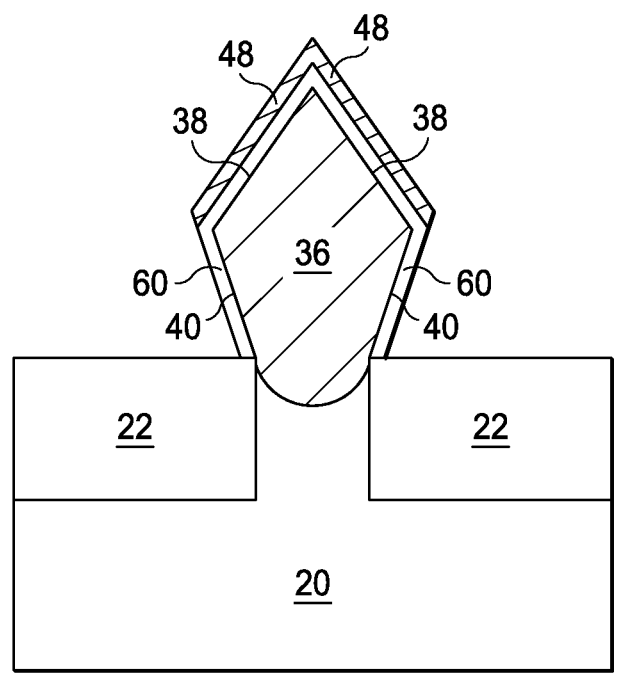
Figure 6:
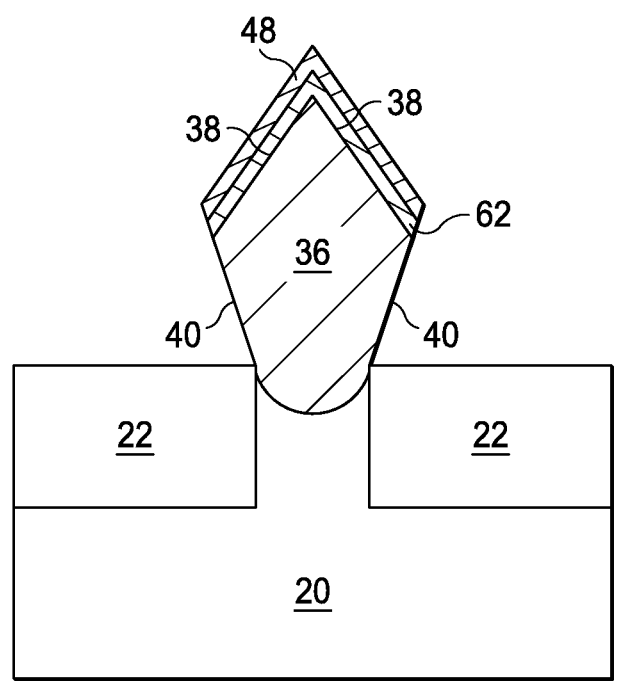

FIGS. 5 and 6 illustrate alternative embodiments. In FIG. 5, silicon interlayer 60 is inserted between SiGe regions 36 and 48. It is realized that silicon has a low selectivity, and hence may be formed on STI regions 22. As a result, silicon interlayer 60 is also formed on down-slant facets 40. However, SiGe region 48 will only be formed on the up-slant facets, but not on down-slant facets, of silicon interlayer 60.

In alternative embodiments as shown in FIG. 6, SiGe interlayer 62 is inserted between SiGe regions 36 and 48. SiGe interlayer 62 may have a germanium atomic percentage between the germanium atomic percentages of SiGe regions 36 and 48. Again, process conditions may be tuned for the formation of SiGe interlayer 62, so that SiGe interlayer 62 is formed only on the up-slant facets 38, but not on the down-slant facets 40, of SiGe region 36, and SiGe region 48 will only be formed on the up-slant facets, but not on the down-slant facets, of SiGe interlayer 62.

Figure 7:
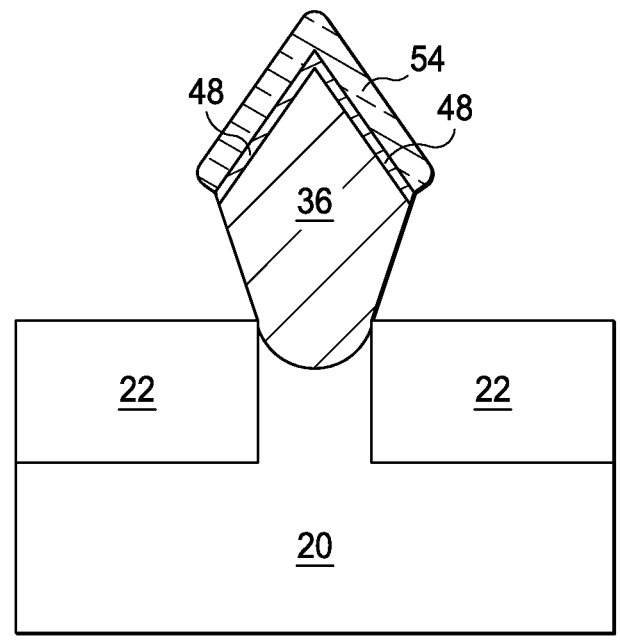

FIG. 7 illustrates the formation of germano-silicide regions 54. Throughout the description, germano-silicide regions 54 are also referred to as silicide regions 54. As is known in the art, germano-silicide regions 54 may be formed by blanket depositing a thin layer of metal (not shown), such as nickel, platinum, palladium, vanadium, titanium, cobalt, tantalum, ytterbium, zirconium, and combinations thereof. The substrate is then heated, which causes silicon and germanium to react with the metal where contacted. After the reaction, a layer of metal germano-silicide 54 is formed between SiGe and metal. The un-reacted metal is selectively removed through the use of an etchant that attacks metal but does not attack the germano-silicide. In an embodiment, the volume of SiGe region 36 is designed to be as large as possible, so as to provide a maximum stress to the channel region of the resulting FinFET device. Accordingly, to maintain an acceptable merging window (which is the distance between neighboring re-grown source/drain regions), SiGe region 48 may be thin. However, since the quality of germano-silicide becomes worse if the germanium atomic percentage is high, the thickness T1 (FIG. 4) of SiGe region 48 may be set close to the thickness that will be consumed by the silicidation process. In the resulting structure, germano-silicide region 54 may contact SiGe region 36. In alternative embodiments, SiGe region 48 may be thicker than what is needed for the silicidation. Accordingly, after the silicidation, a thin layer of SiGe region 48 may be left.

In an embodiment, germano-silicide region 54 is formed over up-slant facets 38, but not extending into down-slant facets 40. It is noted that in germano-silicide regions 54, the atomic percentage of germanium to germanium and silicon will still be the same as the atomic percentage of germanium to germanium and silicon in SiGe region 48, since the newly added metal atoms are not counted. The atomic percentage of germanium to germanium and silicon may be expressed as (number of germanium atoms/(number of germanium atoms+number of silicon atoms).

Although in the above-discussed embodiments, regions 36, 48, and 62 are described as SiGe regions, and the respective transistor is a p-type FinFET, in alternative embodiments, regions 36, 48, and 62 may be SiC regions, while the respective FinFET is an n-type FinFET. It is noted that SiC typically has a much smaller carbon atomic percentage than the germanium atomic percentage in SiGe region. However, the relative atomic carbon percentages in regions 36, 48, and 62 may be realized by one skilled in the art by applying the teaching of the embodiments.

The embodiments have several advantageous features. Comparing the profile as shown in FIGS. 4 and 8, it is noted that by forming SiGe region 48 on up-slant facets 38, but not on down-slant facets 40, the lateral growth may be reduced. For example, if SiGe regions 36 and 48 are grown to a same thickness, SiGe region 48' in FIG. 8 may have a lateral extension distance D1 of 113 Å, while the SiGe region 48 in FIG. 4 only have a lateral extension distance D2 equal to 50 percent of lateral extension distance D1, or 56.5 Å. Accordingly, the merging window in FIG. 4 is increased over the merging window in FIG. 8.

Although the embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. A method comprising:
    forming a fin field-effect transistor (FinFET) comprising:
        forming a semiconductor fin over and adjacent insulation regions, wherein the;
        forming a gate dielectric on a top surface, and extending on sidewalls, of the semiconductor fin;
        forming a gate electrode on the gate dielectric; and
        forming a source/drain region over the insulation regions and adjoining the semiconductor fin, wherein the forming the source/drain region comprises:
            forming a first semiconductor region comprising silicon and an element selected from the group consisting of germanium and carbon, wherein the element has a first atomic percentage in the first semiconductor region, and wherein the first semiconductor region comprises an up-slant facet and a down-slant facet; and
            forming a second semiconductor region comprising silicon and the element, wherein the element has a second atomic percentage in the second semiconductor region with the second atomic percentage being lower than the first atomic percentage, wherein the second semiconductor region comprises a first portion on the up-slant facet and having a first thickness, and wherein a second portion of the second semiconductor region on the down-slant facet has a second thickness smaller than the first thickness.

2. The method of claim 1, wherein, before the step of forming the source/drain region, the semiconductor fin comprises a portion not covered by the gate dielectric and the gate electrode, and wherein the method further comprises:
    removing the portion of the semiconductor fin not covered by the gate dielectric and the gate electrode to form a recess;
    performing the step of forming the first semiconductor region in the recess using an epitaxial growth; and
    performing the step of forming the second semiconductor region using an additional epitaxial growth.

3. The method of claim 1 further comprising siliciding at least a top portion of the second semiconductor region.

4. The method of claim 3, wherein the second semiconductor region is fully silicided.

5. The method of claim 3, wherein a bottom portion of the second semiconductor region is un-silicided.

6. The method of claim 1, wherein the second atomic percentage is lower than the first atomic percentage by greater than about five percent.

7. The method of claim 1, wherein the second thickness is less than 20 percent of the first thickness.

8. The method of claim 1, wherein there is substantially no second portion of the second semiconductor region on the down-slant facet.

9. The method of claim 1, wherein the up-slant facet and the down-slant facet are on (111) planes.

10. The method of claim 1, wherein the down-slant facet and top surfaces of the insulation regions form an angle equal to about 54.7 degrees.

11. A method comprising:
    forming two shallow trench isolation (STI) regions in a silicon substrate and facing each other, with a portion of the silicon substrate therebetween; and
    forming a silicon fin over, and horizontally between, the two STI regions;
    forming a gate dielectric on a top surface, and extends on sidewalls, of the silicon fin;

forming a gate electrode on the gate dielectric;

removing a portion of the silicon fin not covered by the gate dielectric to form a recess;

epitaxially growing a first SiGe region having a first germanium atomic percentage in the recess, wherein the first SiGe region has an up-slant facet on a (111) plane, and a down-slant facet on an additional (111) plane;

epitaxially growing a second SiGe region having a second germanium atomic percentage lower than the first germanium atomic percentage, wherein the second SiGe region contacts the up-slant facet, and wherein substantially none of the second SiGe region is formed on the down-slant facet; and siliciding at least a portion of the second SiGe region.

12. The method of claim 11, wherein the second SiGe region is fully silicided.

13. The method of claim 11, wherein a bottom portion of the second SiGe region is un-silicided.

14. The method of claim 11, wherein the second germanium atomic percentage is lower than the first germanium atomic percentage by greater than about five percent.

15. The method of claim 11, wherein the down-slant facet and top surfaces of the two STI regions form an angle equal to about 54.7 degrees.

16. A method comprising:

epitaxially growing a first SiGe region having a first germanium atomic percentage from a space between two shallow trench isolation (STI) regions, wherein the first SiGe region has an up-slant facet on a (111) plane, and a down-slant facet on an additional (111) plane; and epitaxially growing a second SiGe region having a second germanium atomic percentage lower than the first germanium atomic percentage, wherein the second SiGe region contacts the up-slant facet, and wherein substantially none of the second SiGe region is formed on the down-slant facet.

17. The method of claim 16, wherein the first SiGe region is grown from a level lower than top surfaces of the two STI regions, and wherein the up-slant facet are higher than the top surfaces of the two STI regions.

18. The method of claim 16 further comprising siliciding at least a portion of the second SiGe region.

19. The method of claim 18, wherein a top portion of the second SiGe region on is fully silicided, and wherein a silicide formed the down-slant facet is substantially free from silicide.

20. The method of claim 16 comprising forming a fin field-effect transistor (FinFET), wherein the first SiGe region and the second SiGe region form a source or drain region of the FinFET.

* * * * *